(12) United States Patent
Lam et al.

(10) Patent No.: US 9,379,039 B2
(45) Date of Patent: Jun. 28, 2016

(54) HEAT TRANSFER FOR ELECTRONIC EQUIPMENT

(71) Applicant: CISCO TECHNOLOGY, INC., San Jose, CA (US)

(72) Inventors: Mandy Hin Lam, Fremont, CA (US); Hong Tran Huynh, Fremont, CA (US); M. Baris Dogruoz, Sunnyvale, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 275 days.

(21) Appl. No.: 14/018,189

(22) Filed: Sep. 4, 2013

(65) Prior Publication Data

US 2015/0062820 A1 Mar. 5, 2015

(51) Int. Cl.
*H05K 7/20* (2006.01)
*H01L 23/473* (2006.01)
*H01L 23/40* (2006.01)

(52) U.S. Cl.
CPC .......... *H01L 23/473* (2013.01); *H01L 23/4006* (2013.01); *H01L 2023/405* (2013.01); *H01L 2924/0002* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 6,130,821 A * | 10/2000 | Gerber | ................ | H01L 23/4093 165/185 |
| 6,281,573 B1 * | 8/2001 | Atwood | .............. | H01L 23/3675 165/80.3 |
| 6,411,507 B1 * | 6/2002 | Akram | ................ | H01L 23/3675 165/185 |
| 6,424,533 B1 * | 7/2002 | Chu | ........................ | H01L 23/38 257/930 |
| 6,442,033 B1 * | 8/2002 | Liu | ........................ | H01L 21/563 174/538 |
| 6,465,728 B1 * | 10/2002 | McLaughlin | ....... | H01L 23/4093 174/16.3 |
| 6,545,872 B1 * | 4/2003 | Lonergan | ............. | H01R 12/721 174/252 |
| 6,817,405 B2 | 11/2004 | Kamath et al. | | |

(Continued)

*Primary Examiner* — Anthony Haughton
*Assistant Examiner* — Razmeen Gafur
(74) *Attorney, Agent, or Firm* — Patent Capital Group

(57) ABSTRACT

An apparatus is provided that includes a planar heat conducting material that comprises a first heat sink conduction portion configured to conduct heat between a first integrated circuit and a first heat sink, a second heat sink conduction portion configured to conduct heat between a second integrated circuit and a second heat sink, and a thermal bridge portion configured to conduct heat between the first heat sink conduction portion and the second heat sink conduction portion, such that the thermal bridge portion allows for flexural compensation for a height difference between the first integrated circuit and the second integrated circuit.

18 Claims, 8 Drawing Sheets

(56) References Cited

U.S. PATENT DOCUMENTS

| | | | | |
|---|---|---|---|---|
| 7,518,862 B1* | 4/2009 | Macika | G06F 1/20 | 361/688 |
| 7,552,759 B2* | 6/2009 | Liu | F28D 15/043 | 126/635 |
| 2002/0145854 A1* | 10/2002 | Lin | H01L 23/367 | 361/719 |
| 2004/0052052 A1* | 3/2004 | Rivera | H01L 23/427 | 361/700 |
| 2004/0066630 A1* | 4/2004 | Whittenburg | H01L 23/3733 | 361/719 |
| 2005/0128713 A1* | 6/2005 | Schmidberger | H01L 23/4006 | 361/719 |
| 2005/0167083 A1* | 8/2005 | Belady | H01L 23/34 | 165/80.3 |
| 2005/0219825 A1* | 10/2005 | Campini | G06F 1/183 | 361/719 |
| 2005/0270744 A1* | 12/2005 | Farrow | H01L 23/42 | 361/704 |
| 2006/0126309 A1* | 6/2006 | Bolle | H05K 9/0033 | 361/719 |
| 2006/0133042 A1* | 6/2006 | Belady | G06F 1/189 | 361/704 |
| 2008/0043438 A1* | 2/2008 | Refai-Ahmed | F28D 15/0266 | 361/700 |
| 2008/0121370 A1* | 5/2008 | Luo | H01L 23/427 | 165/80.3 |
| 2008/0216990 A1* | 9/2008 | Min | F28D 15/0233 | 165/80.3 |
| 2008/0251239 A1* | 10/2008 | Mochizuki | H01L 23/427 | 165/104.33 |
| 2010/0321895 A1* | 12/2010 | Hill | H05K 7/20472 | 361/715 |
| 2011/0211314 A1* | 9/2011 | Hong-Chi | H01R 12/716 | 361/718 |
| 2012/0262883 A1* | 10/2012 | Iwata | H01L 23/473 | 361/709 |

* cited by examiner

HEAT TRANSFER FOR ELECTRONIC EQUIPMENT

TECHNICAL FIELD

This disclosure relates in general to the field of thermal transfer systems and, more particularly, to heat transfer for electronic equipment.

BACKGROUND

Over the past several years, information technology (IT) has seen a tremendous increase in performance of electronic equipment. As performance has increased, there has been an accompanying increase in the density of electronic components within electronic equipment. Further, increased performance requirements have led to increased energy usage, which has resulted in increased heat dissipation within an already-crowded equipment space. For example, the rate of increase of heat density for communications equipment was 13% annually from 1992 through 1998, at which time it increased to 28%, and is projected to continue to increase. As a result, data centers are demanding better thermally managed products that have good computing performance coupled with good thermal performance. Thus, there is a need to design electronic equipment with better thermal characteristics.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EXAMPLE EMBODIMENTS

Overview

One or more embodiments may provide a multiple integrated circuit heat distribution apparatus that comprises a planar heat conducting material that comprises a first heat sink conduction portion configured to conduct heat between a first integrated circuit and a first heat sink, a second heat sink conduction portion configured to conduct heat between a second integrated circuit and a second heat sink, and a thermal bridge portion configured to conduct heat between the first heat sink conduction portion and the second heat sink conduction portion, such that the thermal bridge portion allows for flexural compensation for a height difference between the first integrated circuit and the second integrated circuit. In at least one example embodiment, a thickness of the first heat sink conduction portion is substantially the same as a thickness of the thermal bridge portion, and a thickness of the second heat sink conduction portion is substantially the same as the thickness of the thermal bridge portion. In at least one example embodiment, the planar heat conducting material is copper. In at least one example embodiment, the thermal bridge portion is configured to span a distance of substantially fifteen millimeters or less between the first heat sink and the second heat sink, and the thermal bridge portion is 0.3 millimeters thick. In at least one example embodiment, the thermal bridge portion is configured to span a height variation of substantially 3 millimeters or less.

Example Embodiments

Figure 1A:
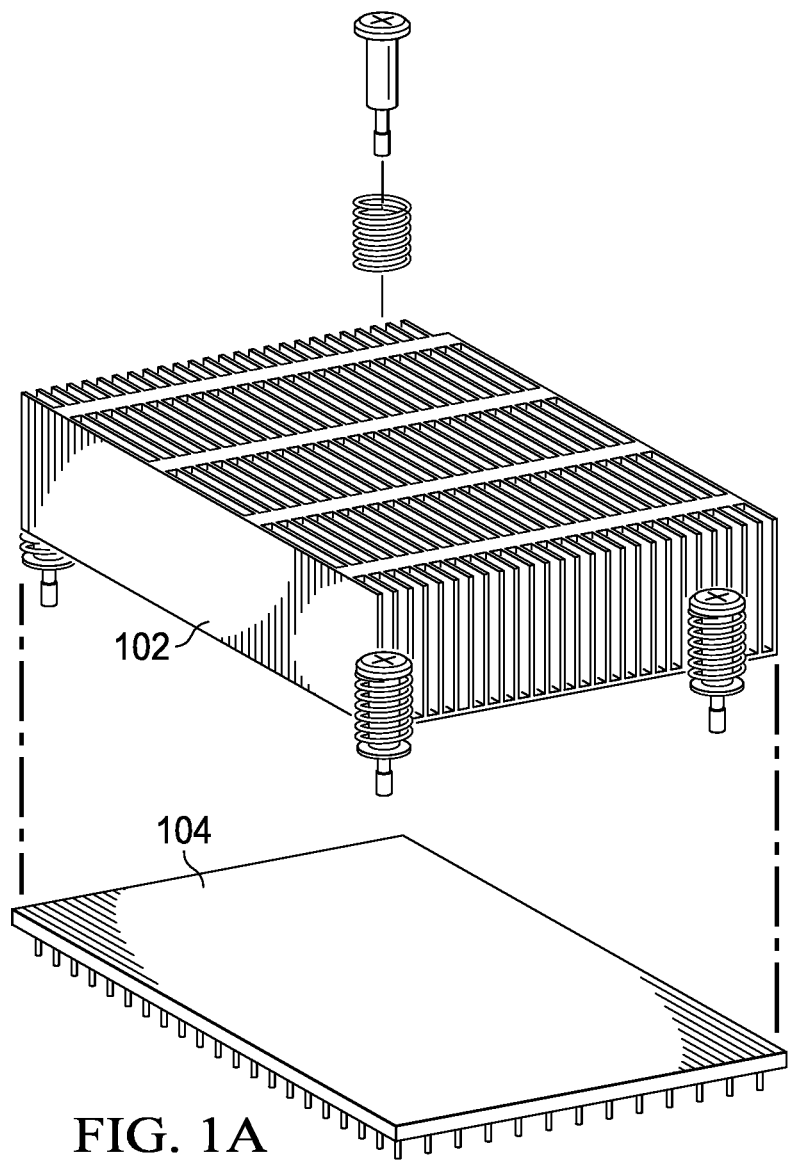
FIGS. 1A-1B are diagrams illustrating heat sinks according to at least one example embodiment.
Figure 1B:
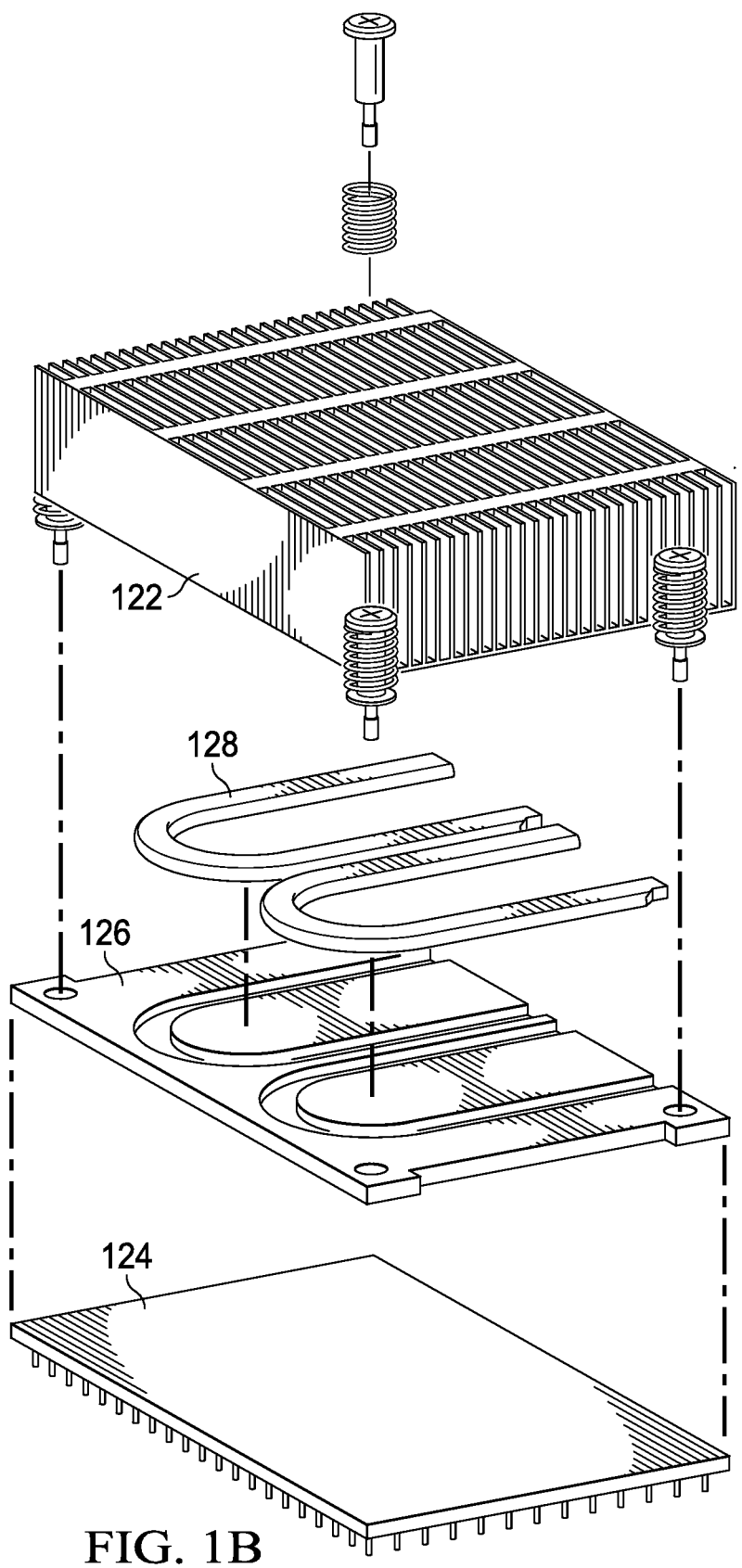

FIGS. 1A-1B are diagrams illustrating heat sinks according to at least one example embodiment. The examples of FIGS. 1A-1B are merely examples, and do not limit the scope of the claims. For example, configuration of the heat sink may vary, coupling of the heat sink may vary, presence of other heat conductive elements may vary, and/or the like.

It should be noted that modern communications equipment includes heat generating electronic components that have to be cooled to enable them to perform effectively. Typically, the electronic components are cooled using air that is forced into the equipment chassis and made to flow over the electronic components. In data center environments with large number of electronic components, thermal management can be a challenge. Some data centers utilize a hot aisle/cold aisle layout design for server racks and other computing equipment to conserve energy and lower cooling costs by managing airflow effectively.

As capabilities of integrated circuits has increased, the amount of power consumed by integrated circuits has increased as well. In most circumstances, integrated circuits generate heat in proportion to power consumption. Therefore, as the capabilities of integrated circuits has increased, so has the amount of heat generated by operation of the integrated circuit. Many apparatus designs involve utilization of a heat sink to aid in dissipation of heat from the integrated circuit.

In at least one example embodiment, a heat sink can relate to a passive heat exchanger component that cools a device by dissipating heat into a surrounding medium, such as air. For example, in computing systems, heat sinks may be used to cool integrated circuits, such as central processing units, graphics processors, and/or the like. Heat sinks may be used with high-power semiconductor devices such as power transistors, optoelectronic devices, such as lasers and light emitting diodes (LEDs), and/or wherever the heat dissipation ability of the basic device package may be insufficient to control its temperature.

A heat sink may be designed to increase the surface area in contact with the cooling medium surrounding it, such as the air. In many circumstances, approaching air velocity, choice of material, fin (or other protrusion) design and surface treatment may be some of the factors that affect the thermal performance of the heat sink. In this manner, a heat sink may be utilized to transfer heat from an integrated circuit to the surrounding air.

The heat sink may comprise a base portion and a fin portion. The base point may relate to a part of the heat sink that receives heat from the integrated circuit. The fin portion may relate to a portion of the heat sink that transfers heat from the base portion to the surrounding air. In some circumstances, the fins of the fin portion may visually appear to be shaped as a fin. However, in other circumstances, the fin portion may bear little resemblance to a fin, but may nonetheless be designed to dissipate heat. In this manner, the fin portion may be any configuration of material that distributes heat from the base portion of the heat sink to the surrounding air.

The term integrated circuit may refer to a set of electronic circuits that are comprised by a single package, or multiple packages. An integrated circuit may be referred to as a chip, a microchip, etc. There are many types of circuits that may be comprised by an integrated circuit. For example, an integrated circuit may comprise a microprocessor, a memory circuit, an analog circuit, an application specific integrated circuit (ASIC), and/or the like.

In some circumstances, a heat sink may be coupled to the integrated circuit. For example, the heat sink may be coupled to the integrated circuit such that there are intermediate devices between the heat sink and the integrated circuit. Additionally, the heat sink may be coupled directly to the integrated circuit, and/or the like.

The example of FIG. 1A is a diagram illustrating a heat sink 102 coupled to an integrated circuit 104. In at least one example embodiment, there may be a thermal compound between the integrated circuit and the heat sink. For example, the physical structure of the base portion of the heat sink and the integrated circuit may be such that gaps exist between parts of the base portion of the heat sink and parts of the integrated circuit. In some circumstances, such gaps may comprise air. In some circumstances, such gaps may comprise a thermal compound to aid in heat transfer. For example, the thermal compound may be more heat conductive than air. In such circumstances, the heat transfer between the integrated circuit and the heat sink may benefit from utilization of the thermal compound between the integrated circuit and the heat sink.

The example of FIG. 1B is a diagram illustrating heat sink 122 coupled to integrated circuit 124 such that heat pipe set 128 and base plate 126 are disposed between heat sink 122 and integrated circuit 124. In some circumstances, an integrated circuit may fail to generate heat uniformly throughout the integrated circuit. In such circumstances, it may be desirable to utilize a heat pipe set to distribute heat from one part of the integrated circuit to a part of the heat sink that is not directly coupled with that part of the integrated circuit. For example, the heat pipe may be more heat conductive than the base portion of the heat sink. In such circumstances, the heat pipe may benefit in transferring heat from a part of the integrated circuit to a part of the base portion of the heat sink that is at a different location. In this manner, the overall heat dissipation of the integrated circuit may benefit by way of reduction of concentration of heat in such portions. In some circumstances, the base plate relates to a plate that is configured to house the heat pipe set and conduct heat from the integrated circuit to the heat pipe. In some circumstances, there may be thermal compound between the base plate and the integrated circuit, between the heat pipe set and the base plate, between the heat pipe set and the base portion of the heat sink, between the base plated and the base portion of the heat sink, and/or the like. Even though the example of heat pipe set 128 relates to two heat pipes, the number of heat pipes comprised by a heat pipe set may vary. For example, there may be a single heat pipe, more than two heat pipes, and/or the like. In addition, the shape and/or configuration of the heat pipe may vary.

The heat sink may be coupled to a printed circuit board upon which the integrated circuit is mounted. For example, the heat sink may be coupled to the integrated circuit for purposes of heat conduction, and may be coupled to the printed circuit board for purposes of position and structure retention. In this manner, the heat conduction of the heat sink may be, at least partially, independent of the manner in which the heat sink retains its position with respect to the printed circuit board. Even though the examples of FIGS. 1A and 1B illustrate the heat sink comprising screws for coupling the heat sink to a printed circuit board, any suitable structure may be utilized to couple the heat sink to the printed circuit board, such as a clip, a latch, an adhesive, and/or the like.

Figure 2B:
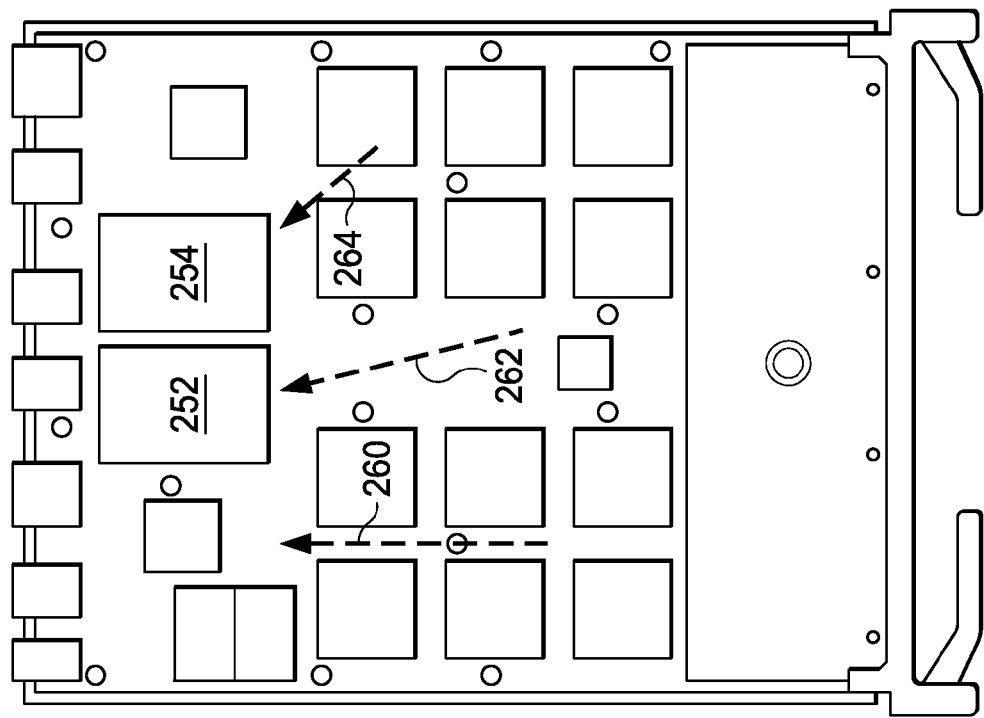
FIGS. 2A-2B are diagrams illustrating electronic equipment airflow according to at least one example embodiment.
Figure 2A:
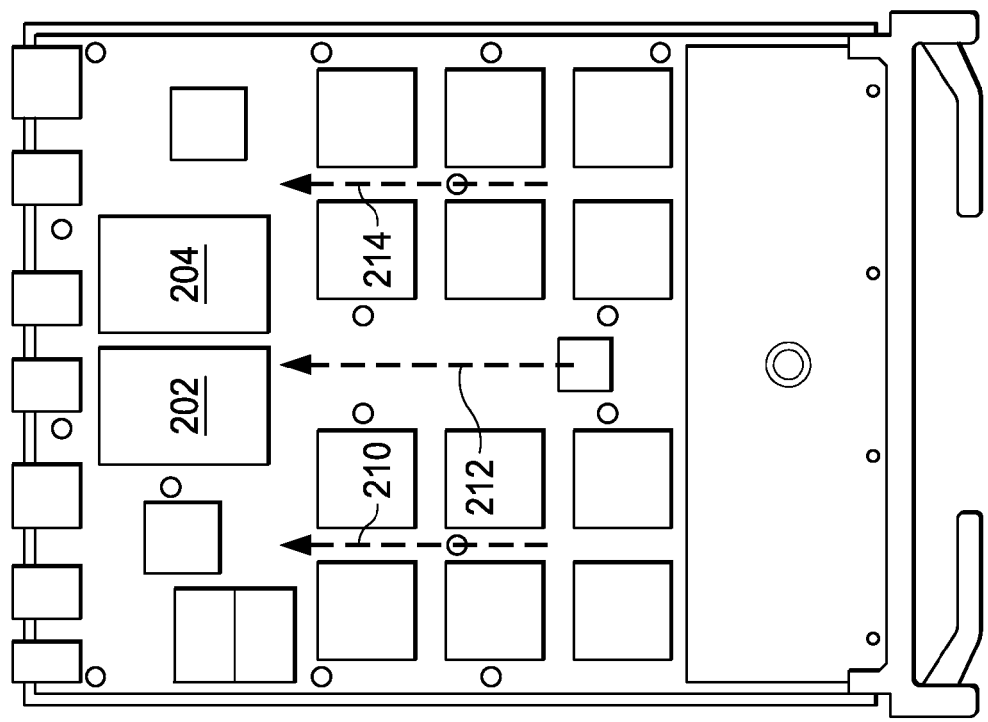

FIGS. 2A-2B are diagrams illustrating electronic equipment airflow according to at least one example embodiment. The examples of FIGS. 2A-2B are merely examples, and do not limit the scope of the claims. For example, component arrangement may vary, airflow pattern may vary, airflow magnitude may vary, and/or the like.

As previously stated, the heat dissipated by a heat sink may be dependent upon the airflow across the surface area of the heat sink. For example, the heat dissipated by a heat sink may be dependent upon the airflow across the surface area of the fin portion of the heat sink. For example, a heat sink may dissipate a lesser amount of heat when there is less airflow across the fin portion of the heat sink than when there is a greater amount of airflow across the fin portion of the heat sink. In at least one example embodiment, the airflow across the heat sink may be based, at least in part, on the direction of the airflow incident to the heat sink. For example, the fin design of the heat sink may be optimized for airflow in a particular direction, a set of particular directions, and/or the like. For example, the fin design illustrated in FIGS. 1A-1B may dissipate more heat when airflow aligns with the direction of the fins. For example, when airflow aligns with the direction of the fins, there may be airflow along most of the surface of the fins. However, when airflow is unaligned with the fins, one fin may disrupt airflow across another fin, eddy currents may develop, etc. Such circumstances may result in lesser airflow across the heat sink based, at least in part, on the direction of the airflow.

In at least one example embodiment, an apparatus may comprise one or more fans for generating airflow across one or more heat sinks. In at least one example embodiment, the apparatus may comprise a plurality of fans that generate airflow in accordance with an airflow design. For example, the apparatus may be designed such that airflows through the apparatus in an intentional manner. For example, the designed airflow may be such that the airflow pattern aids in heat sink heat dissipation more efficiently than a different airflow pattern. For example, the airflow pattern may be designed to align airflow with one or more heat sinks such that disruption of airflow attributable to heat sinks, or portions of heat sinks, is reduced.

FIG. 2A is a diagram illustrating electronic equipment airflow according to at least one example embodiment. It can be seen that the electronic equipment comprises heat sinks 202 and 204. The example of FIG. 2A illustrates an example indicative of a designed airflow. In the example of FIG. 2A, arrows 210, 212, and 214 indicate airflow such that the direction of each arrow illustrates the direction of the airflow and the length of each arrow illustrates the magnitude of the airflow. In the example of FIG. 2A, it can be seen that the airflow at arrows 210, 212, and 214 are of substantially similar direction and magnitude. In at least one example embodiment, the design of heat sinks 202 and 204 may be such that heat sinks 202 and 204 dissipate more heat under the airflow conditions indicated by arrows 210, 212, and 214, than under different airflow conditions.

In some circumstances, one or more fans of the electronic equipment may become disabled, for example the fan may malfunction, a circuit associated with operation of the fan may malfunction, power allocated to the fan may be insufficient, and/or the like. In such circumstances, the airflow pattern of the electronic equipment may be altered by the disablement of the fan. For example, magnitude of airflow may change, direction of airflow may change, and/or the like. In at least one example embodiment, disablement of a fan causes a disproportionate change in airflow through a heat sink in relation to airflow through another heat sink.

FIG. 2B is a diagram illustrating electronic equipment airflow according to at least one example embodiment. The example of FIG. 2B relates to electronic equipment having a designed airflow similar to the airflow of FIG. 2A, but under circumstances where at least one fan has become disabled. It can be seen that the airflow at arrow 260 is substantially similar to the airflow at arrow 210 of FIG. 2A. However, it can be seen that airflow 262 differs from the airflow of arrow 212 of FIG. 2A by way of having a lesser magnitude and a leftward direction. Furthermore, it can be seen that airflow 264 differs from the airflow of arrow 214 of FIG. 2A by way of having a much lesser magnitude and a greater leftward direction. In the example of FIG. 2B, heat sinks 252 and 254 are designed to be substantially similar to heat sinks 202 and 204. For example, heat sinks 252 and 254 may be designed such that airflow indicated in FIG. 2A causes heat sinks 252 and 254 to dissipate more heat than the airflow of FIG. 2B. It can further be seen that the airflow pattern of FIG. 2B results in a disproportionate change airflow through heat sink 252 in relation to heat sink 254. For example, the airflow of FIG. 2A illustrates an airflow such that heat sinks 252 and 254 experience similar airflow. However, it can be seen that the airflow of FIG. 2B results in significantly lesser airflow through heat sink 254 than through heat sink 252. In such circumstances, the fan disablement of the example of FIG. 2B may disproportionately impact heat sinks 252 and 254. In such an example, the integrated circuit that dissipates heat by way of heat sink 254 may become overheated much more rapidly than the integrated circuit that dissipates heat by way of heat sink 252. In such circumstances, the functionality of the electronic equipment may benefit from an apparatus that allows more similar heat dissipation between heat sink 252 and heat sink 254 under such fan disablement conditions. For example, it may be desirable for the integrated circuit that dissipates heat by way of heat sink 254 to be able to also dissipate heat by way of heat sink 252. In such circumstances, the operation of the integrated circuit to which heat sink 254 is coupled may experience prolonged operation under such fan disablement than in circumstances where the integrated circuit is unable to dissipate heat by way of heat sink 252. In this manner, it may be desirable to provide a thermal coupling between the heat sink of an integrated circuit and a different heat sink of a different integrated circuit.

Figure 3A:
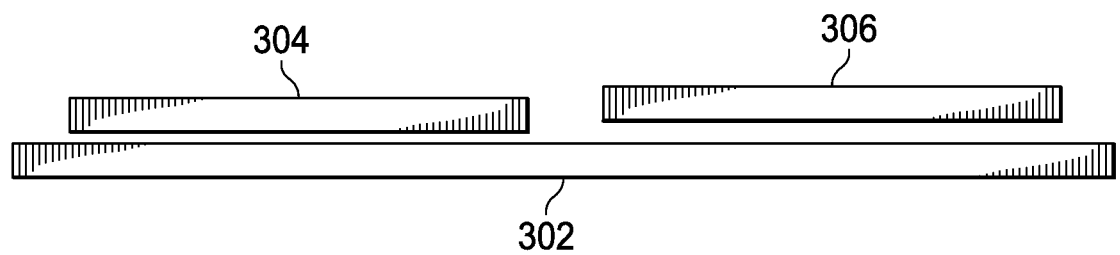
FIGS. 3A-3B are diagrams illustrating integrated circuit mounting variation according to at least one example embodiment.
Figure 3B:
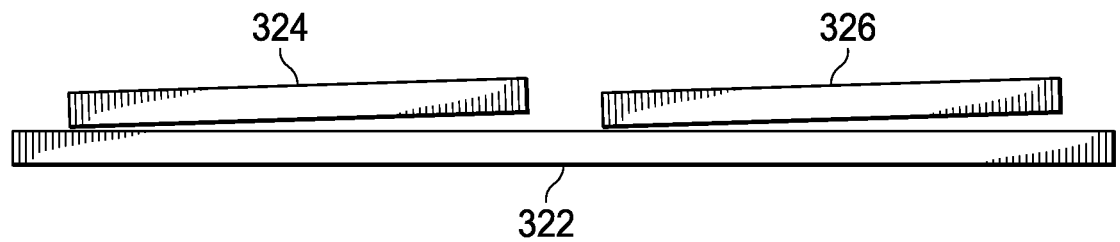

FIGS. 3A-3B are diagrams illustrating integrated circuit mounting variation according to at least one example embodiment. The examples of FIGS. 3A-3B are merely examples, and do not limit the scope of the claims. For example, orientation may vary, type of variation may vary, configuration of integrated circuit may vary, and/or the like.

In designing an apparatus to thermally connect different heat sinks that are coupled with different integrated circuits, it may be desirable for the apparatus to be configured to allow for a difference in the height of the integrated circuits, the angle of the surface of the integrated circuits, and/or the like. In many manufacturing processes that mount integrated circuits to printed circuit boards, there may be variation in the height of different integrated circuits, the angle of different integrated circuits, and/or the like. For example, the manufacturing process may cause slight deviation in mounted height of one or more integrated circuits. Some manufacturing processes may allow for a deviation of up to 3 millimeter in the height of adjacent integrated circuits. Therefore, in circumstances where the apparatus is thermally coupling adjacent integrated circuits, it may be desirable for the apparatus to be flexible enough so that the apparatus may be coupled with both integrated circuits without significant reduction in the surface area contact with the integrated circuit.

FIG. 3A is a diagram illustrating integrated circuit mounting variation according to at least one example embodiment. The example of FIG. 3A illustrates integrated circuits 304 and 306 mounted on printed circuit board 302. It can be seen that integrated circuit 306 is mounted such that there is a height difference between integrated circuits 304 and 306. In the example of FIG. 3B, the height difference may be attributable to a difference in the mounting height of integrated circuit 304 and the mounting height of integrated circuit 306. It may be common for such height differences to occur in some manufacturing processes.

FIG. 3B is a diagram illustrating integrated circuit mounting variation according to at least one example embodiment. The example of FIG. 3B illustrates integrated circuits 324 and 326 mounted on printed circuit board 322. It can be seen that integrated circuit 326 is mounted such that there is a height difference between the adjacent edges of integrated circuits 324 and 326. In the example of FIG. 3B, the height difference may be attributable to a deviation in the mounting angle of integrated circuits 304 and 306 from being parallel to the printed circuit board. It may be common for such angle differences to occur in some manufacturing processes. Even though the example of FIG. 3B illustrates the mounting angles of integrated circuits 324 and 326 varying in similar ways, in some circumstances the mounting angle of adjacent integrated circuits may differ by way of orientation, magnitude, and/or the like.

Figure 4A:
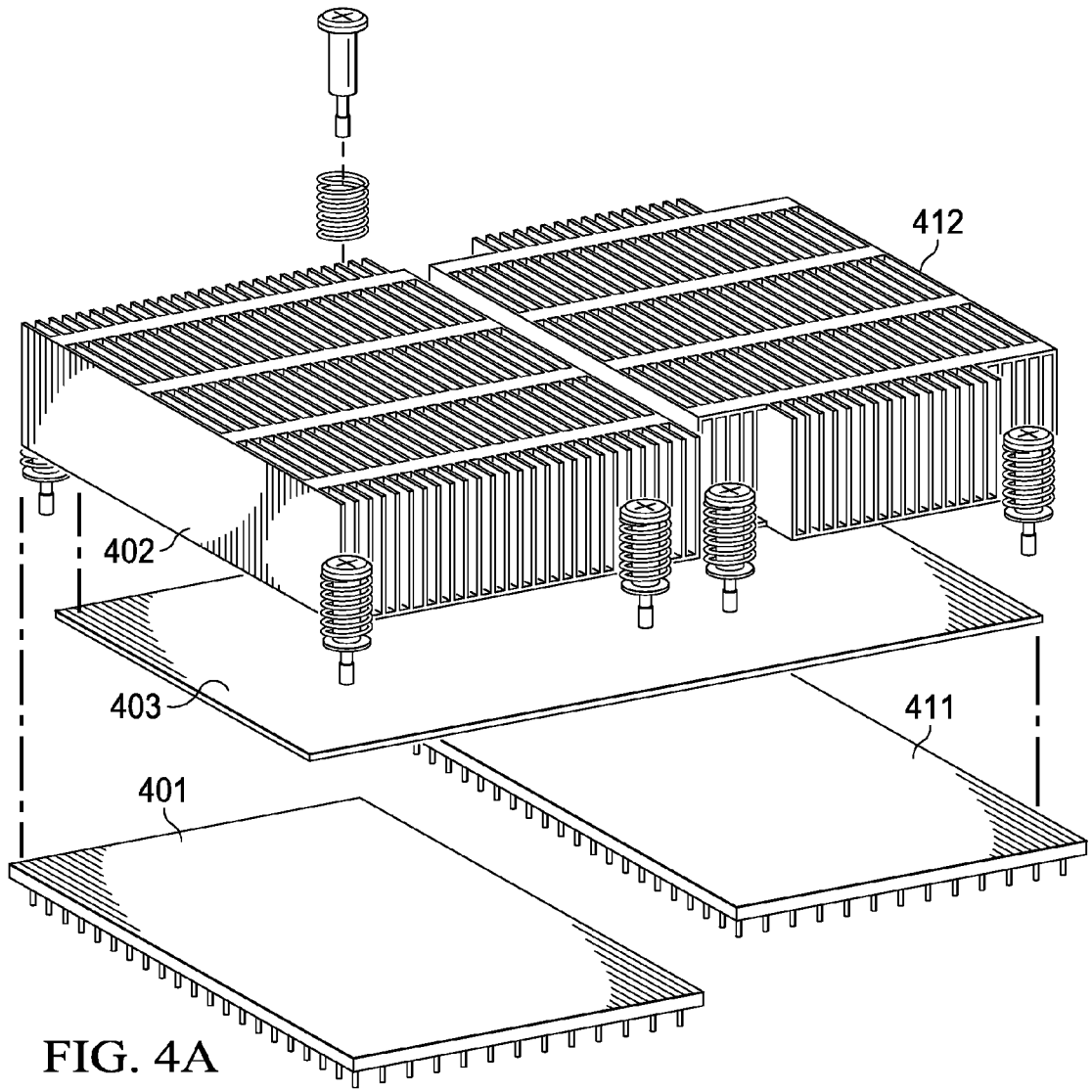
FIGS. 4A-4B are diagrams illustrating a multiple integrated circuit heat distribution apparatus according to at least one example embodiment.
Figure 4B:
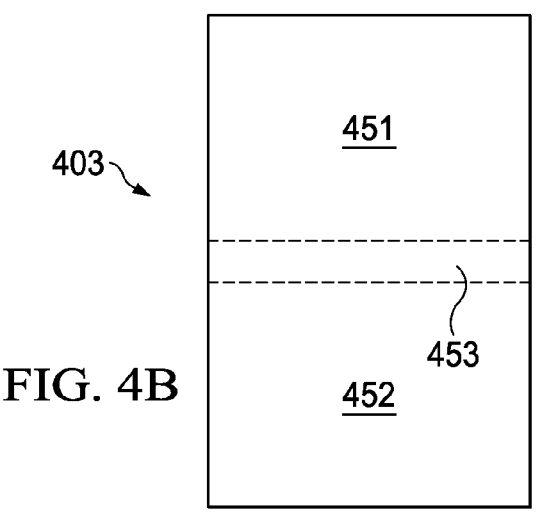

FIGS. 4A-4B are diagrams illustrating a multiple integrated circuit heat distribution apparatus according to at least one example embodiment. The examples of FIGS. 4A-4B are merely examples, and do not limit the scope of the claims. For example, size of one or more portions of the multiple integrated circuit heat distribution apparatus may vary, thickness of one or more portions of the multiple integrated circuit heat distribution apparatus may vary, presence of other heat conductive elements may vary, and/or the like.

As previously discussed, in some circumstances, electronic equipment may be designed such that fans generate a designed airflow pattern across heat sinks of the electronic equipment. In such circumstances, one or more of the fans may become disabled in a manner that causes the airflow pattern to change. For example, the airflow pattern may change in a way that causes a heat sink to dissipate less heat than an adjacent heat sink. For example, the magnitude of airflow across the heat sinks may differ, favorability of airflow across heat sinks may differ, angle of airflow across heat sinks may differ, and/or the like. In such circumstances, the integrated circuit that relies upon heat dissipation from the heat sink that has lesser airflow may overheat such that performance of the integrated circuit is compromised. For example, the integrated circuit may become inefficient, may malfunction, may become damaged, and/or the like. In such circumstances, in addition to the heat sink coupled to a particular integrated circuit, it may be beneficial for such adjacent integrated circuits to utilize a heat sink of an adjacent integrated circuit as well. For example, it may be desirable to an integrated circuit to dissipate heat by way of a heat sink mounted to the integrated circuit as well as by way of a heat sink mounted to an adjacent integrated circuit. In this manner, airflow changes that disproportionally impact a heat sink of an integrated circuit may be mitigated by cross utilization of heat sinks by the integrated circuit.

In such electronic equipment, the electronic equipment may receive airflow across a first heat sink that is coupled with a first integrated circuit and may receive airflow across a second heat sink that is coupled with a second integrated circuit. As previously described, in some circumstances, the airflow pattern may change, such that the airflow across the second heat sink causes the second heat sink to dissipate more heat than the first heat sink. In other words, the first heat sink may be cooled by the airflow to a lesser extent than the second heat sink. In such an example, it may be desirable to provide an apparatus that conducts heat from the first integrated circuit to the second heat sink, to reduce the impact of the disproportionate airflow. Such an apparatus may be referred to as a multiple integrated circuit heat distribution apparatus. In at least one example embodiment, a multiple integrated circuit heat distribution apparatus relates to an apparatus that transfers heat form an integrated circuit to a heat sink that is mounted upon the integrated circuit and to a heat sink that is mounted upon a different integrated circuit. In at least one example embodiment, the multiple integrated circuit heat distribution apparatus may be coupled between a first integrated circuit and a first heat sink, and be coupled between a second integrated circuit and a second heat sink. In circumstances of the previous example, such an apparatus may receive heat from the first integrated circuit at a portion of a multiple integrated circuit heat distribution apparatus that is coupled between the first heat sink and the first integrated circuit. In such an example, the electronic equipment may transfer heat from the portion of the multiple integrated circuit heat distribution apparatus that is coupled between the first heat sink and the first integrated circuit to a portion of the multiple integrated circuit heat distribution apparatus that is coupled between the second heat sink and the second integrated circuit. In this manner, the multiple integrated circuit heat distribution apparatus may transfer heat to the second heat sink.

In at least one example embodiment, the multiple integrated circuit heat distribution apparatus relates to a planar heat conducting material that is configured to be coupled between coupled between a first integrated circuit and a first heat sink, and be coupled between a second integrated circuit and a second heat sink. The heat conductive material may relate to any material that conducts heat better than air. However, it may be desirable for the heat conductive material to conduct heat similarly or better than the material of the first sink and/or the material of the second heat sink. For example, the heat conducting material may be copper, aluminum, silver, and/or the like.

FIGS. 4A-4B illustrate multiple integrated circuit heat distribution apparatus 403 in relation to integrated circuit 401, integrated circuit 411, heat sink 402, and heat sink 412. It can be seen that multiple integrated circuit heat distribution apparatus 403 is configured to be coupled directly between integrated circuit 401 and heat sink 402, and directly between integrated circuit 411 and heat sink 412. FIG. 4B illustrates various portions of multiple integrated circuit heat distribution apparatus 403. Multiple integrated circuit heat distribution apparatus 403 comprises heat sink conduction portion 451. In at least one example embodiment, a heat sink conduction portion of a multiple integrated circuit heat distribution apparatus relates to apportion of the multiple integrated circuit heat distribution apparatus that is positioned between a heat sink and an integrated circuit. In this manner, the heat sink conduction portion may be configured to conduct heat between an integrated circuit and a heat sink, such as a heat sink mounted to the integrated circuit. For example, heat sink conduction portion 451 relates to a portion of multiple integrated circuit heat distribution apparatus 403 that is positioned between heat sink 402 and integrated circuit 401. In this manner, heat sink conduction portion 451 is configured to conduct heat from integrated circuit 401 to heat sink 402. Similarly, heat sink conduction portion 452 relates to a portion of multiple integrated circuit heat distribution apparatus 403 that is positioned between heat sink 412 and integrated circuit 411. In this manner, heat sink conduction portion 452 is configured to conduct heat from integrated circuit 411 to heat sink 412.

It may be desirable for dimensions of a heat sink conduction portion to relate to dimensions of the corresponding heat sink. For example, it may be desirable to avoid circumstances where the dimensions of the heat sink are such that a region of the surface of the integrated circuit fails to conduct heat to the heat sink. For example, the heat sink conduction portion may be sized similarly to a base portion of a heat sink. In some circumstances, it may be desirable for the dimensions of the heat sink conduction portion to fail to include a region that dimensionally corresponds with a mounting portion of the heat sink. For example, it may be desirable to avoid mimicry of a screw housing of the heat sink by the heat sink conduction portion of the multiple integrated circuit heat conduction apparatus. Therefore, it may desirable for width of a heat sink conduction portion to be greater than or substantially equal to width of the first integrated circuit. In at least one example embodiment, substantially equal relates to variation within manufacturing tolerances. Similarly, it may be desirable for length of the heat sink conduction portion to be greater than or substantially equal to length of the first integrated circuit.

As previously described, it may be desirable for the multiple integrated circuit heat conduction apparatus to conduct heat from an integrated circuit to a heat sink of a different integrated circuit. In at least one example embodiment, such heat conduction comprises conduction of heat from a first heat conduction portion of the multiple integrated circuit heat conduction apparatus to a second heat conduction portion of the multiple integrated circuit heat conduction apparatus. In at least one example embodiment, the multiple integrated circuit heat conduction apparatus comprises a thermal bridge portion that is configured to conduct heat between the first heat sink conduction portion and the second heat sink conduction portion. In the example of FIG. 4B, multiple integrated circuit heat conduction apparatus 403 comprises thermal bridge portion 453. Thermal bridge portion 453 is configured to transfer heat between heat sink conduction portions 451 and 452. The thermal bridge portion of the multiple integrated circuit heat conduction apparatus may relate to a portion of the multiple integrated circuit heat conduction apparatus that spans the distance between the first heat sink and the second heat sink. For example, thermal bridge portion 453 may span the distance between heat sink 402 and heat sink 412. Even though the example of multiple integrated circuit heat conduction apparatus 403 relates to two heat sink conduction portions, number of heat sink conduction portions may vary. For example, there may be more than two heat conduction portion. Even though the dimensions of the heat conduction portions of the example of multiple integrated circuit heat conduction apparatus 403 are similar, in some embodiments, dimensions of different heat sink conduction portions may differ from each other. Similarly, in some embodiments shape and/or dimensions of the thermal bridge may vary from the example of multiple integrated circuit heat conduction apparatus 403.

Similarly as described regarding FIGS. 3A-3B, there may be a height difference between a first integrated circuit and a second integrated circuit. Furthermore, the height difference may vary between different production instances of the same electronic equipment based, at least in part, on the manufacturing process. Therefore, it may be desirable for the thermal bridge portion of the multiple integrated circuit heat conduction apparatus to allow for flexural compensation for a height difference between the first integrated circuit and the second integrated circuit.

In at least one example embodiment, flexural compensation relates to the thermal bridge portion being configured to flex in a manner that allows for surface mounting of each heat sink conduction portion in a manner that allows for alignment of the heat sink conduction portion and the heat sink, for alignment of the heat sink conduction portion and the integrated circuit, and/or the like. For example, the thermal bridge portion may be sufficiently flexural to allow heat sink conduction portion 451 to align with the surface of integrated circuit 401, while allowing heat sink conduction portion 452 to align with the surface of integrated circuit 411.

In at least one example embodiment, the thickness of the thermal bridge portion is designed to allow for flexural compensation of the first heat sink conduction portion and the second heat sink conduction portion over a span that between the first integrated circuit and the second integrated circuit, such that the flex of the thermal bridge portion allows for full range of angular deviation and/or height deviation between the first integrated circuit and the second integrated circuit in accordance with design and/or manufacturing tolerances of the electronic equipment. For example, thickness of the thermal bridge portion may be based, at least in part, on manufacturing tolerances of the electronic equipment and the span between the heat sinks. In this manner, the flexural aspect of the thermal bridge portion may relate to desirability of a thin thermal bridge portion. However, the heat conduction aspect of the thermal bridge portion may relate to desirability for a thick thermal bridge portion. In this manner, the thermal bridge portion may be designed to allow for both flexural compensation within the tolerances of the manufacturing process of the electronic equipment, and to allow for designed heat flow between heat sink conduction portions. For example, the thermal bridge portion may be configured to span a height variation of substantially 3 millimeters or less and to span a distance of substantially fifteen millimeters or less between the first heat sink and the second heat sink. In such an example, the thermal bridge portion may be 0.3 millimeters thick.

It can be seen that one of the possible benefits of the planar configuration of the multiple integrated circuit heat conduction apparatus may be the ease of manufacturing such an apparatus. For example, the multiple integrated circuit heat conduction apparatus may be manufactured by properly dimensioning a sheet of heat conductive material. Therefore, it may be desirable for thickness of the first heat sink conduction portion to be substantially the same as a thickness of the thermal bridge portion, and for thickness of the second heat sink conduction portion to be substantially the same as the thickness of the thermal bridge portion. In at least one example embodiment, substantially the same thickness relates to a thickness that may vary within manufacturing tolerances.

It may be desirable for the multiple integrated circuit heat conduction apparatus to be coupled with components in a manner that allows for efficient heat conduction between the multiple integrated circuit heat conduction apparatus and the component. In at least one example embodiment, there may be a thermal compound disposed between the multiple integrated circuit heat conduction apparatus and a component to which the multiple integrated circuit heat conduction apparatus is coupled. For example, a heat sink may be coupled with the heat sink conduction portion with a thermal compound material disposed therebetween. Similarly, the heat sink conduction portion may be coupled with the integrated circuit with a thermal compound material disposed therebetween. In at least one example embodiment, the heat sink is coupled with the heat sink conduction portion by way of brazing. In this manner, the multiple integrated circuit heat conduction apparatus may be comprised by a unitary apparatus that further comprises the coupled heat sinks.

Figure 5:
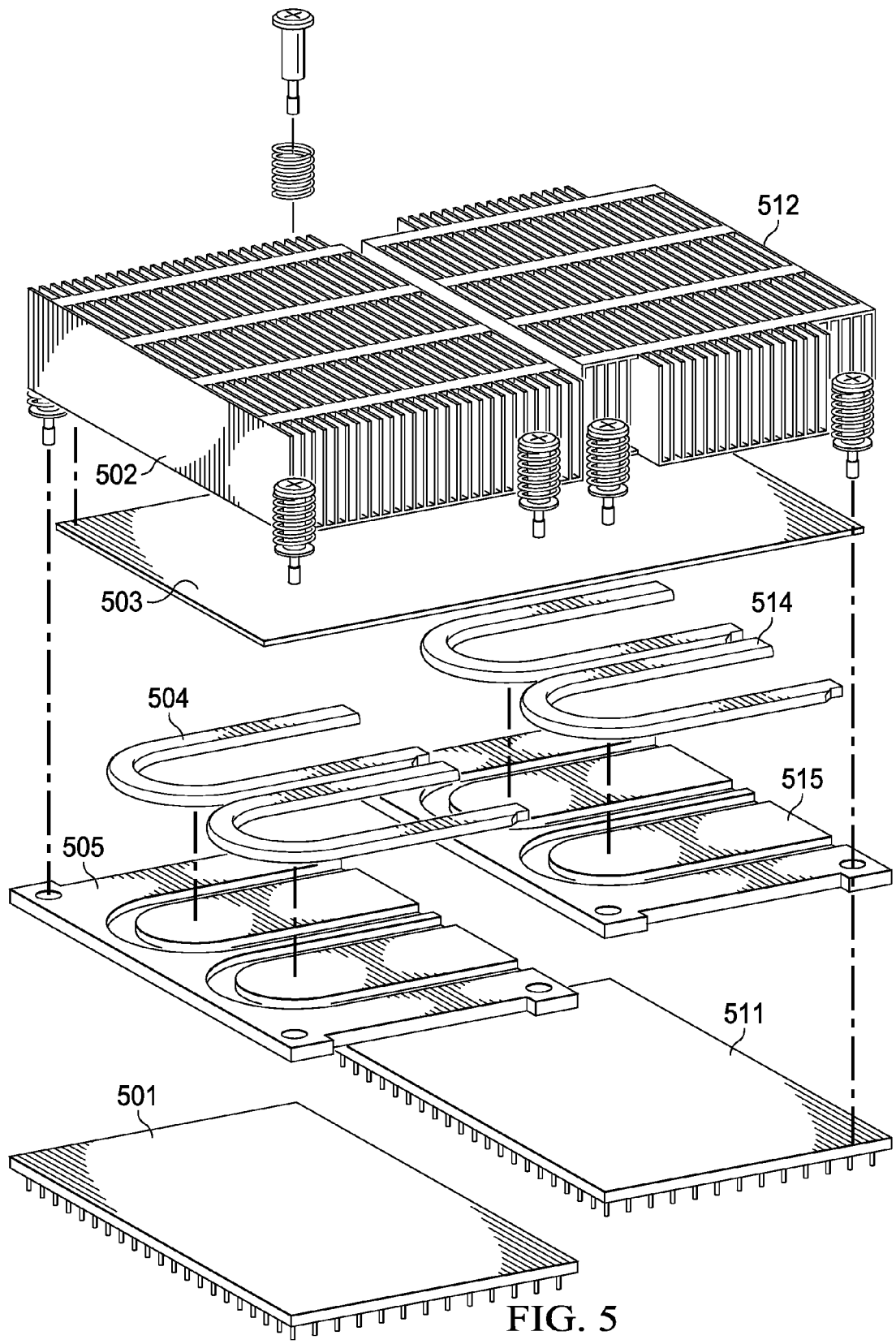
FIG. 5 is a diagram illustrating a multiple integrated circuit heat distribution apparatus according to at least one example embodiment.

FIG. 5 is a diagram illustrating a multiple integrated circuit heat distribution apparatus according to at least one example embodiment. The example of FIG. 5 is merely an example, and does not limit the scope of the claims. For example, size of one or more portions of the multiple integrated circuit heat distribution apparatus may vary, thickness of one or more portions of the multiple integrated circuit heat distribution apparatus may vary, presence of other heat conductive elements may vary, and/or the like.

In the example of FIG. 5, multiple integrated circuit heat conduction apparatus 503 is coupled with heat sinks 502 and 512 and with integrated circuits 501 and 511. As described regarding FIG. 1B, it may be desirable to utilize a heat pipe set and a base plate to assist in heat conduction between the integrated circuit and the associated heat sink. Similarly, it may be desirable to utilize a heat pipe set and a base plate in conjunction with a multiple integrated circuit heat conduction apparatus. In the example of FIG. 5, heat pipe set 504 and base plate 505 are disposed between multiple integrated circuit heat conduction apparatus 503 and integrated circuit 501. Similarly, heat pipe set 514 and base plate 515 are disposed between multiple integrated circuit heat conduction apparatus 503 and integrated circuit 511. However, in some embodiments, the heat pipe set and the base plate may be disposed between the multiple integrated circuit heat conduction apparatus and the heat sink. For example, there may exist an embodiment, where heat pipe set 504 and base plate 505 are disposed between multiple integrated circuit heat conduction apparatus 503 and heat sink 502. Similarly, there may exist an embodiment, where heat pipe set 514 and base plate 515 are disposed between multiple integrated circuit heat conduction apparatus 503 and heat sink 512.

Figure 6:
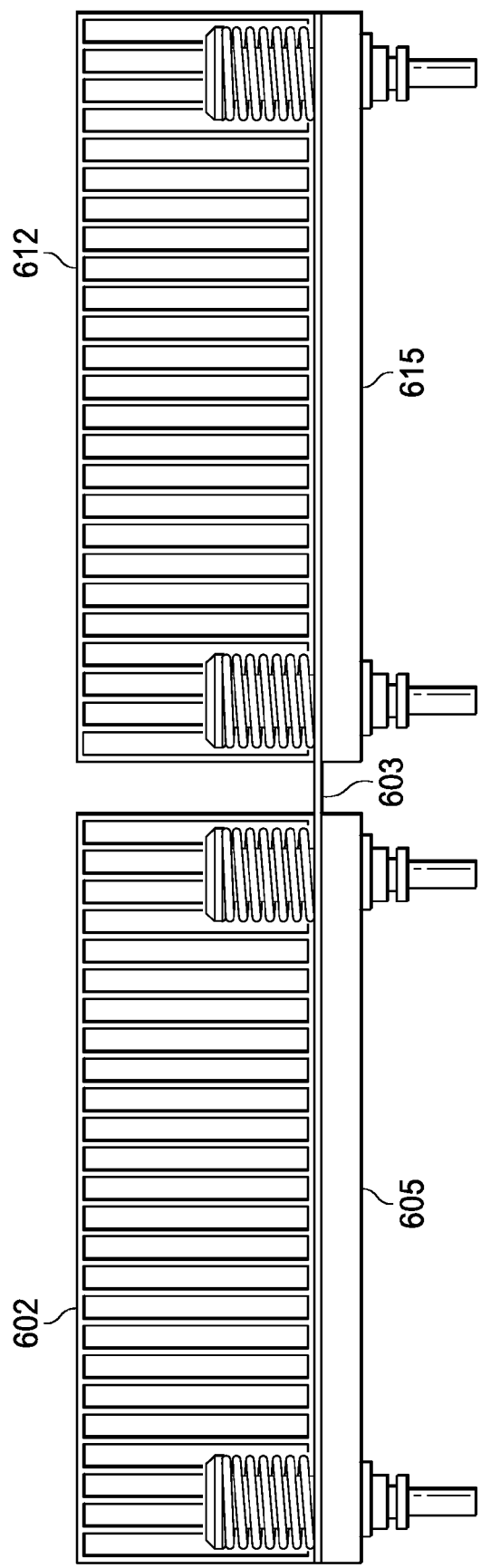
FIG. 6 is a diagram illustrating a multiple integrated circuit heat distribution apparatus according to at least one example embodiment.

FIG. 6 is a diagram illustrating a multiple integrated circuit heat distribution apparatus according to at least one example embodiment. The example of FIG. 6 is merely an example, and does not limit the scope of the claims. For example, size of one or more portions of the multiple integrated circuit heat distribution apparatus may vary, thickness of one or more portions of the multiple integrated circuit heat distribution apparatus may vary, presence of other heat conductive elements may vary, and/or the like.

The example of FIG. 6 illustrates multiple integrated circuit heat conduction apparatus 603 coupled with heat sinks 602 and 612 and combined base plate and heat pipe set components 605 and 615. In at least one example embodiment, the configuration components of the example of FIG. 6 may relate to a unitary apparatus that may be couple with a pair of integrated circuits. The components of FIG. 6 may be coupled by way of brazing, by way of an intervening thermal compound, and/or the like.

Figure 7:
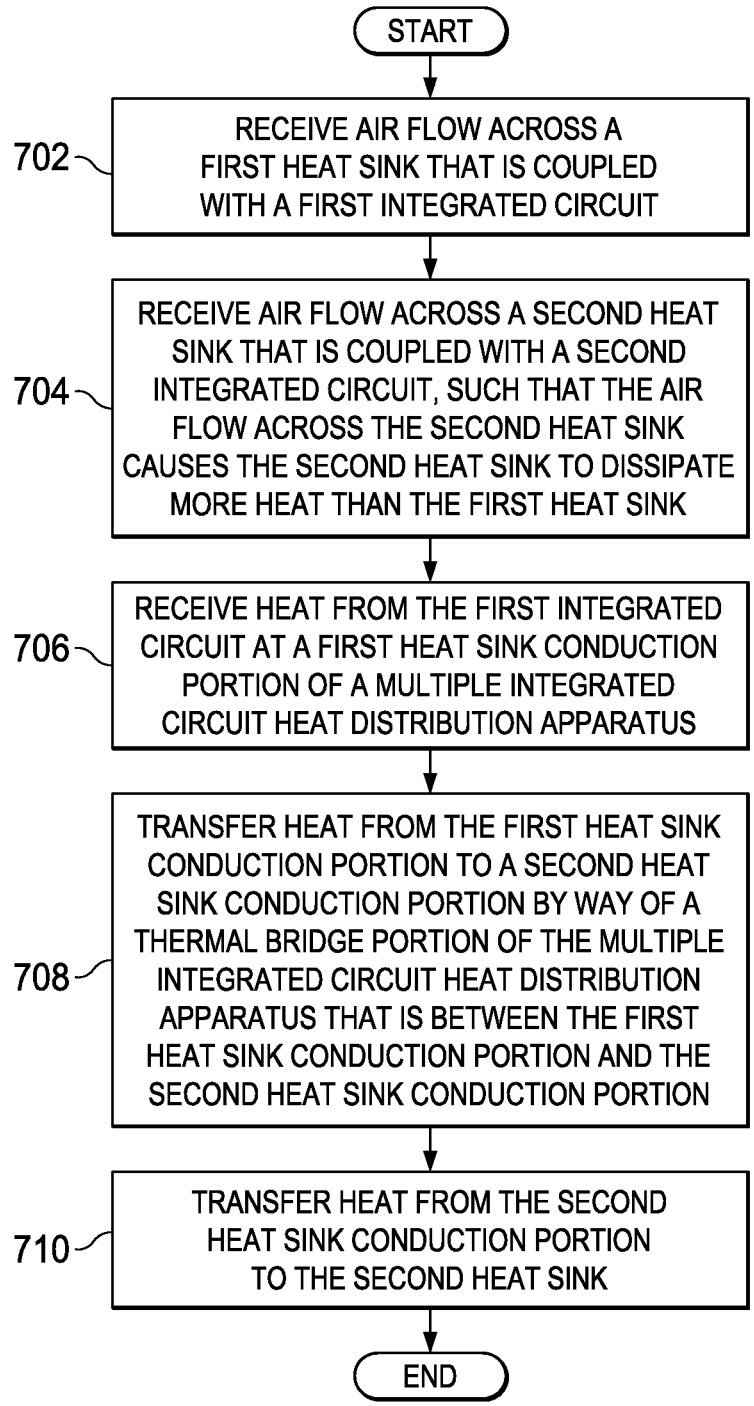
FIG. 7 is a simplified flow diagram illustrating example operations that may be associated with an embodiment of a multiple integrated circuit heat distribution apparatus.

Turning to FIG. 7, FIG. 7 is a simplified flow diagram illustrating example operations that may be associated with an embodiment of a multiple integrated circuit heat distribution apparatus. For example, the blocks of FIG. 7 may be performed by an apparatus that comprises the multiple integrated circuit heat conduction apparatus.

At block 702, the apparatus receives airflow across a first heat sink that is coupled with a first integrated circuit. The airflow, the first heat sink, and the first integrated circuit may be similar as described regarding FIGS. 1A-1B, FIGS. 2A-2B, and/or the like. At block 704, the apparatus receives airflow across a second heat sink that is coupled with a second integrated circuit, such that the airflow across the second heat sink causes the second heat sink to dissipate more heat than the first heat sink. The airflow, the second heat sink, and the second integrated circuit may be similar as described regarding FIGS. 1A-1B, FIGS. 2A-2B, and/or the like.

At block 706, the apparatus receives heat from the first integrated circuit at a first heat sink conduction portion of a multiple integrated circuit heat distribution apparatus. The first heat sink conduction portion and the multiple integrated circuit heat conduction apparatus may be similar as described regarding FIGS. 4A-4B, FIG. 5, FIG. 6, and/or the like.

At block 708, the apparatus transfers heat from the first heat sink conduction portion to a second heat sink conduction portion of the multiple integrated circuit heat distribution apparatus by way of a thermal bridge portion of the multiple integrated circuit heat distribution apparatus that is between the first heat sink conduction portion and the second heat sink conduction portion. The thermal bridge portion, the second heat sink conduction portion, and the transfer of heat may be similar as described regarding FIGS. 4A-4B, FIG. 5, FIG. 6, and/or the like. At block 710, the apparatus transfers heat from the second heat sink conduction portion to the second heat sink. In this manner, the second heat sink may dissipate the transferred heat by way of the heat sink and the airflow.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is imperative to note that countless possible design configurations can be used to achieve the operational objectives outlined here. Accordingly, the associated infrastructure of a multiple integrated circuit heat distribution apparatus may have a myriad of substitute arrangements, design choices, device possibilities, hardware configurations, equipment options, etc. It is also important to note that the operations and steps described with reference to the preceding FIGURES illustrate only some of the possible scenarios that may be executed by, or within, the apparatus. Some of these operations may be deleted or removed where appropriate, or these steps may be modified or changed considerably without departing from the scope of the discussed concepts.

In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

Although the present disclosure has been described in detail with reference to particular arrangements and configurations, these example configurations and arrangements may be changed significantly without departing from the scope of the present disclosure.

Even though specific embodiments describe specific materials and material characteristics, in various embodiments, the elements of a multiple integrated circuit heat distribution apparatus may be composed of any kind of materials, including metal, plastic, wood, fiber glass, semiconductors, etc., or a combination thereof. Therefore, any suitable material, including metallic materials may be used.

While screws and similar attachment mechanisms are illustrated in the FIGURES, it may be noted that any kind of attachment mechanisms may be used, including clips, latches, grooves, or other mating and connection devices. In embodiments where the components are removably attached to each other, the attachment mechanisms may be appropriately configured to enable the components to be removed as needed. In other embodiments, where the components are permanently attached to each other, the attachment mechanisms may be appropriately configured to disable separation between the components without destroying them. Examples of such permanent attachment mechanisms include welding, brazing, gluing, etc.

In terms of the dimensions of the articles discussed herein, any suitable length, width, and depth (or thickness) may be used and can be based on particular end user needs, or specific elements to be addressed by the apparatus (or the system in which it resides). It is imperative to note that all of the specifications and relationships outlined herein (e.g., height, width, length, space volume, slot or hole diameter, number of slots or holes per unit of area, etc.) have only been offered for purposes of example and teaching only. Each of these data may be varied considerably without departing from the spirit of the present disclosure, or the scope of the appended claims. The specifications apply only to one non-limiting example and, accordingly, should be construed as such. Along similar lines, the materials used in constructing the articles can be varied considerably, while remaining within the scope of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A multiple integrated circuit heat distribution apparatus, comprising a planar heat conducting material that comprises:
   a first heat sink conduction portion configured to conduct heat between a first integrated circuit and a first heat sink;

a second heat sink conduction portion configured to conduct heat between a second integrated circuit and a second heat sink;

a thermal bridge portion configured to conduct heat between the first heat sink conduction portion and the second heat sink conduction portion, such that the thermal bridge portion allows for flexural compensation for a height difference between the first integrated circuit and the second integrated circuit; and a first base plate and a first heat pipe set, wherein the first base plate is configured to house the first heat pipe set such that the first base plate and the first heat pipe set are disposed between the first heat sink and the first integrated circuit, and wherein the first heat sink conduction portion is disposed between the first heat sink and a combination of the first base plate and an entirety of the first heat pipe set.

2. The apparatus of claim 1, wherein a thickness of the first heat sink conduction portion is substantially the same as a thickness of the thermal bridge portion, and a thickness of the second heat sink conduction portion is substantially the same as the thickness of the thermal bridge portion.

3. The apparatus of claim 1, wherein the planar heat conducting material is copper.

4. The apparatus of claim 3, wherein the thermal bridge portion is configured to span a distance of substantially fifteen millimeters or less between the first heat sink and the second heat sink, and the thermal bridge portion is 0.3 millimeters thick.

5. The apparatus of claim 1, wherein the thermal bridge portion is configured to span a height variation of substantially 3 millimeters or less.

6. The apparatus of claim 1, wherein width of the first heat sink conduction portion is configured to be greater than or substantially equal to width of the first integrated circuit, length of the first heat sink conduction portion is configured to be greater than or substantially equal to length of the first integrated circuit, width of the second heat sink conduction portion is configured to be greater than or substantially equal to width of the second integrated circuit, and length of the second heat sink conduction portion is configured to be greater than or substantially equal to length of the second integrated circuit.

7. The apparatus of claim 1, further comprising the first heat sink and the second heat sink.

8. The apparatus of claim 7, wherein the first heat sink is coupled with the first heat sink conduction portion with a thermal compound material disposed therebetween.

9. The apparatus of claim 8, wherein the thermal compound relates to a compound that conducts heat better than air, and the thermal compound is disposed between the first heat sink conduction portion and the first heat sink such that amount of air between the first heat sink and the first heat sink conduction portion is less than an amount of air associated with a coupling between the first heat sink and the first heat sink conduction portion that is absent the thermal compound.

10. The apparatus of claim 7, wherein the first heat sink is coupled with the first heat sink conduction portion by way of brazing.

11. The apparatus of claim 7, further comprising the first integrated circuit, wherein at least one of the first base plate or the first heat pipe set is coupled with the first integrated circuit with a thermal compound material disposed therebetween.

12. The apparatus of claim 7, wherein the first base plate and the first heat pipe set are disposed between the first heat sink and the first heat sink conduction portion.

13. The apparatus of claim 12, further comprising the first integrated circuit, wherein the first heat sink conduction portion is coupled with the first integrated circuit with a thermal compound material disposed therebetween.

14. The apparatus of claim 7, further comprising a second base plate and a second heat pipe set, such that the second base plate is configured to house the second heat pipe set such that the second base plate and the second heat pipe set are disposed between the second heat sink and the second integrated circuit.

15. The apparatus of claim 14, wherein the second heat sink conduction portion is disposed between the second heat sink and the second base plate and the second heat pipe set.

16. A method for cooling an integrated circuit, comprising:
receiving airflow across a first heat sink that is coupled with a first integrated circuit;
receiving airflow across a second heat sink that is coupled with a second integrated circuit, such that the airflow across the second heat sink causes the second heat sink to dissipate more heat than the first heat sink;
receiving heat from the first integrated circuit at a first heat sink conduction portion of a multiple integrated circuit heat distribution apparatus, the first heat sink conduction portion being coupled between the first heat sink and the first integrated circuit, wherein the heat received at the first heat sink conduction is received from a first base plate and a first heat pipe set, the first base plate being configured to house the first heat pipe set such that the first base plate and the first heat pipe set are disposed between the first heat sink and the first integrated circuit, and wherein the first heat sink conduction portion is disposed between the first heat sink and a combination of the first base plate and an entirety of the first heat pipe set;
transferring heat from the first heat sink conduction portion to a second heat sink conduction portion of the multiple integrated circuit heat distribution apparatus, the second heat sink conduction portion being coupled between the second heat sink and the second integrated circuit, and the transferring occurring by way of a thermal bridge portion of the multiple integrated circuit heat distribution apparatus that is between the first heat sink conduction portion and the second heat sink conduction portion; and
transferring heat from the second heat sink conduction portion to the second heat sink.

17. The method of claim 16, wherein there is a height difference between a surface of the first integrated circuit and a surface of the second integrated circuit.

18. The method of claim 16, wherein the thermal bridge portion is configured to allow for flexural compensation for a height difference between the first integrated circuit and the second integrated circuit.

\* \* \* \* \*